(12) United States Patent
Shimoida et al.

(10) Patent No.: US 7,714,352 B2
(45) Date of Patent: May 11, 2010

(54) HETERO JUNCTION SEMICONDUCTOR DEVICE

(75) Inventors: Yoshio Shimoida, Yokosuka (JP);
Masakatsu Hoshi, Yokohama (JP);
Tetsuya Hayashi, Yokosuka (JP);
Hideaki Tanaka, Yokohama (JP);
Shigeharu Yamagami, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 242 days.

(21) Appl. No.: 11/701,429

(22) Filed: Feb. 2, 2007

(65) Prior Publication Data
US 2007/0181886 A1 Aug. 9, 2007

(30) Foreign Application Priority Data
Feb. 9, 2006 (JP) ............................. 2006-031887
Feb. 9, 2006 (JP) ............................. 2006-032596

(51) Int. Cl.
*H01L 31/0312* (2006.01)
*H01L 31/036* (2006.01)
*H01L 29/10* (2006.01)
*H01L 29/93* (2006.01)

(52) U.S. Cl. .................... 257/135; 257/348; 257/77; 257/94; 257/504; 257/402

(58) Field of Classification Search ............... 257/330, 257/135, 136, 77, 327, 328, 329, 331, 192, 257/368, 51, 402, 94, 348, 492, 493, 498, 257/504, 598, 183
See application file for complete search history.

(56) References Cited

U.S. PATENT DOCUMENTS 3,648,127 A * 3/1972 Lenzlinger .................. 257/361
3,678,347 A * 7/1972 Tulp et al. ..................... 257/66
3,896,483 A * 7/1975 Whelan ....................... 257/403
RE28,704 E * 2/1976 Robinson et al. ............. 438/217
4,194,133 A * 3/1980 Shannon ....................... 377/60
4,292,642 A * 9/1981 Appels et al. ................ 257/169
4,433,343 A * 2/1984 Levine ......................... 257/290
4,598,461 A * 7/1986 Love ............................ 438/273
4,656,493 A * 4/1987 Adler et al. .................. 257/376
4,769,685 A * 9/1988 MacIver et al. .............. 257/260
5,426,326 A * 6/1995 Ohyu et al. .................. 257/408

(Continued)

FOREIGN PATENT DOCUMENTS

JP 2003-318398 A 11/2003

*Primary Examiner*—Leonardo Andújar
*Assistant Examiner*—Teresa M. Arroyo
(74) *Attorney, Agent, or Firm*—Foley & Lardner LLP

(57) ABSTRACT

A semiconductor device, includes: a first conductivity-semiconductor substrate; a hetero semiconductor region for forming a hetero junction with the first conductivity-semiconductor substrate; a gate electrode adjacent to a part of the hetero junction by way of a gate insulating film; a drain electrode connecting to the first conductivity-semiconductor substrate; a source electrode connecting to the hetero semiconductor region; and a second conductivity-semiconductor region formed on a part of a first face of the first conductivity-semiconductor substrate in such a configuration as to oppose the gate electrode via the gate insulating film, the gate insulating film, the hetero semiconductor region and the first conductivity-semiconductor substrate contacting each other to thereby form a triple contact point. A first face of the second conductivity-semiconductor region has such an impurity concentration that allows a field from the gate electrode to form an inversion layer on the first face of the second conductivity-semiconductor region.

13 Claims, 7 Drawing Sheets

U.S. PATENT DOCUMENTS

| | | | | |
|---|---|---|---|---|
| 5,981,996 A | * | 11/1999 | Fujishima | 257/335 |
| 6,555,872 B1 | * | 4/2003 | Dennen | 257/327 |
| 7,061,027 B2 | * | 6/2006 | Tanaka et al. | 257/192 |
| 2004/0217358 A1 | * | 11/2004 | Kaneko | 257/77 |
| 2005/0098846 A1 | * | 5/2005 | Nagaoka | 257/487 |
| 2005/0133794 A1 | * | 6/2005 | Hayashi et al. | 257/77 |
| 2005/0199873 A1 | * | 9/2005 | Tanaka et al. | 257/20 |

* cited by examiner

HETERO JUNCTION SEMICONDUCTOR DEVICE

BACKGROUND OF THE INVENTION

1. Field of the Invention

The present invention relates to a semiconductor device.

2. Description of the Related Art

Japanese Patent Application Laid-Open No. JP2003-318398 (=JP2003318398) discloses a silicon carbide semiconductor device, specifically, a field effect transistor using a hetero interface. According to the above related art, a voltage applied to a gate electrode controls thickness of a barrier at the hetero interface, and a tunnel current allows a carrier to pass by when an element is on. In this case, a channel region such as MOSFET is not present, thereby providing a power semiconductor switch having high voltage capability (high reverse blocking voltage) and low on-resistance.

The above related art has such a structure that a P type region is formed on the gate electrode and on a silicon carbide SiC region below the gate electrode, thereby relaxing a field applied to a gate insulating film. Without connecting the P type region's potential to a source potential, however, the above field relaxing effect is restrictive, thus making it difficult to protect the gate insulating film.

Moreover, the P type region is formed in a position sufficiently adjacent to a drive point where i) the gate insulating film, ii) the hetero semiconductor region including polycrystalline silicon and iii) an SiC region contact each other. With the above structure, sufficiently implementing the field relaxing when the element is off may narrow a current passage when the element is on, thus increasing an on-resistance, which is a trade off, failing to sufficiently effect a good inherent feature of the device.

SUMMARY OF THE INVENTION

It is an object of the present invention to provide a semiconductor device having high voltage capability (high reverse blocking voltage) and low on-resistance.

It is another object of the present invention to provide a semiconductor device which is unlikely to cause a current breakage.

According to an aspect of the present invention, there is provided a semiconductor device, comprising: 1) a first conductivity-semiconductor substrate; 2) a hetero semiconductor region configured to form a hetero junction in combination with the first conductivity-semiconductor substrate; 3) a gate electrode configured to be adjacent to a part of the hetero junction by way of a gate insulating film; 4) a drain electrode configured to connect to the first conductivity-semiconductor substrate; 5) a source electrode configured to connect to the hetero semiconductor region; and 6) a second conductivity-semiconductor region formed on a part of a first face of the first conductivity-semiconductor substrate in such a configuration as to oppose the gate electrode by way of the gate insulating film, the gate insulating film, the hetero semiconductor region and the first conductivity-semiconductor substrate contacting each other to thereby form a triple contact point, wherein a first face of the second conductivity-semiconductor region is configured to have such an impurity concentration that allows a field from the gate electrode to form an inversion layer on the first face of the second conductivity-semiconductor region.

The other object(s) and feature(s) of the present invention will become understood from the following description with reference to the accompanying drawings.

DESCRIPTION OF THE PREFERRED EMBODIMENTS

First, Second and Third Embodiments

According to the following first, second and third embodiments of the present invention, there is provided a semiconductor device where a semiconductor substrate is made of silicon carbide SiC, a hetero semiconductor region is made of polycrystalline silicon, a first conductivity type is N, and a second conductivity type is P.

First Embodiment

Referring to FIG. 1 to FIG. 6, a semiconductor device 100 is to be set forth, according to the first embodiment of the present invention.

Figure 1:
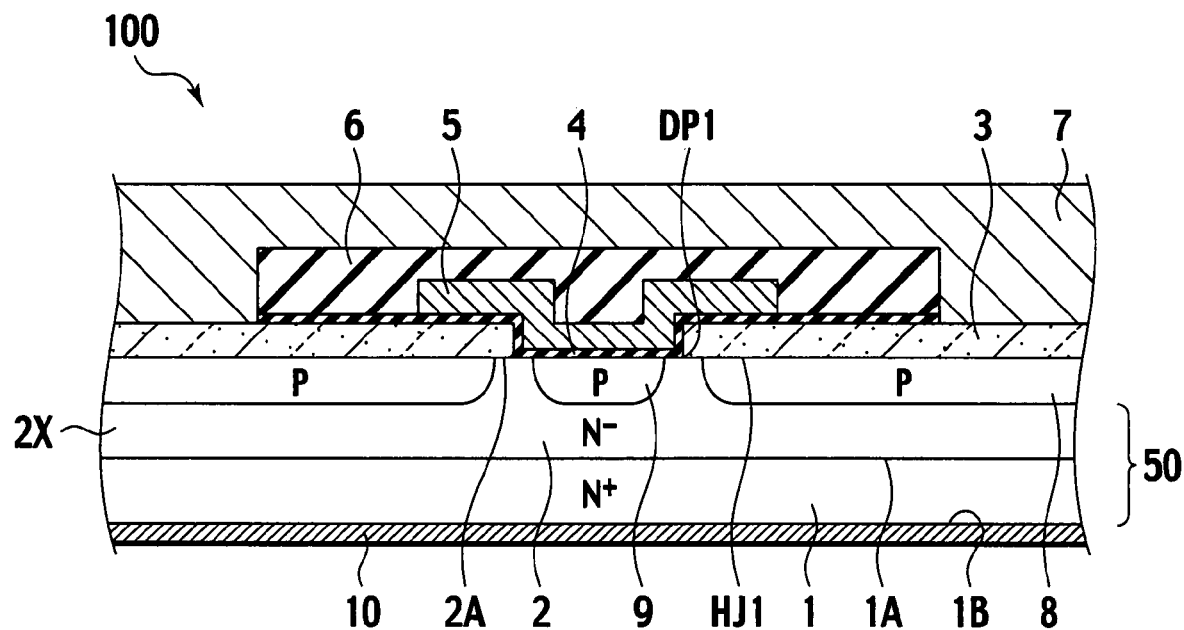
FIG. 1 is a cross sectional view of a structure of a semiconductor device (field effect transistor device), according to a first embodiment of the present invention.

FIG. 1 shows a cross sectional structure of a field effect transistor device which is the semiconductor device 100 under the present invention. In the above cross section, two unit cells are oppositely arranged. Actually however, a plurality of the unit cells are connected in parallel, thus forming the field effect transistor. The description is to be made, however, based on the above typical cross sectional structure.

<Structure>

At first, in terms of structure, there is provided an $N^+$ type SiC substrate region 1, with the superscript "+" denoting a high concentration. The $N^+$ type SiC substrate region 1 has a first face 1A on which an $N^-$ type SiC drain region 2 is formed, with the superscript "−" denoting a low concentration. The drain region 2 includes an epitaxial layer 2X grown on the SiC substrate region 1. A semiconductor substrate 50 having the first conductivity type includes the epitaxial layer 2X and the $N^+$ type SiC substrate region 1. The SiC has various polycrystalline structures. Hereinafter, a typical 4H—SiC is to be used. Other polycrystalline structures such as 6H—SiC and 3C—SiC are likewise allowed.

FIG. 1 (FIGS. 2-4 and 6-8 as well, to be set forth afterward) omits a concept of thickness of each of the substrate region 1 and the drain region 2. Actually, the substrate region 1 has a thickness of several 100 µm while the drain region 2 has a thickness of several µm to ten-plus (19.9999 . . . ) µm.

On a first face 2A side (a side opposite to the substrate region 1 side) of the $N^-$ type SiC drain region 2, there is formed a hetero semiconductor region 3 which is made of $N^+$ type polycrystalline silicon and forms a hetero junction HJ1 in combination with the semiconductor substrate 50. The SiC (of each of the substrate region 1 and the drain region 2) and the polycrystalline silicon (of the hetero semiconductor region 3) are different from each other in band gap and electron affinity. The hetero junction HJ1 is formed in an interface between the SiC and the polycrystalline silicon, that is why the polycrystalline silicon is referred to as a hetero semiconductor region.

There is provided a gate electrode 5 adjacent to a part of the hetero junction HJ1 (between the $N^-$ type SiC drain region 2 and the $N^+$ type hetero semiconductor region 3) by way of a gate insulating film 4. The $N^+$ type hetero semiconductor region 3 directly connects to a source electrode 7. The substrate region 1 has a second face 1B to which a drain electrode 10 is connected (ohmic contact) at a low electrical resistance. An interlayer insulating film 6 insulates the gate electrode 5 from the source electrode 7.

In FIG. 1, there is provided a triple contact point which is defined as a drive point DP 1 where the gate insulating film 4, the $N^+$ type hetero semiconductor region 3 and the $N^-$ type SiC drain region 2 (which is a part of the semiconductor substrate 50) have a contact with each other. On the first face 2A of the $N^-$ type SiC drain region 2 in position spaced apart from the drive point DP1, there is provided a P type field relaxing region 8 below the hetero semiconductor region 3 and in the interface between the hetero semiconductor region 3 and the $N^-$ type SiC drain region 2.

Moreover, on the first face 2A of the $N^-$ type SiC drain region in the position spaced apart from the drive point DP 1, there is provided a P type field relaxing region 9 below the gate electrode 5 in such a manner as to be opposed to the gate electrode 5 by way of the gate insulating film 4. The P type field relaxing region 9 is a semiconductor region having the second conductivity type.

The P type field relaxing region 9 below the gate electrode 5 relaxes the field applied to the gate insulating film 4.

It is necessary to connect the P type field relaxing region 9 to the source electrode 7. Under the present invention, devising the flat layout of the semiconductor device 100 accomplishes the above connection.

Figure 5:
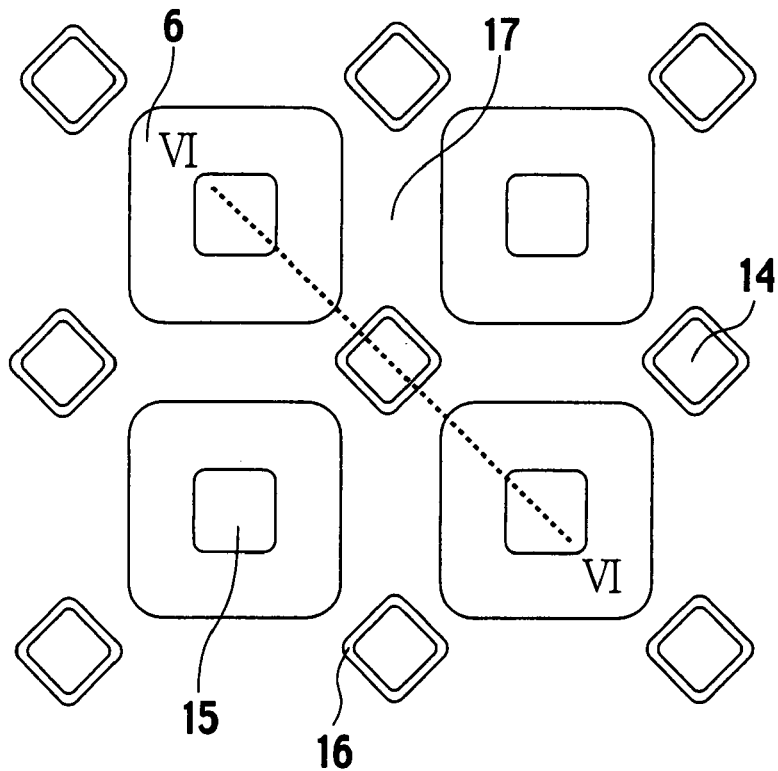
FIG. 5 shows a flat layout of a unit cell, according to the first embodiment of the present invention.

FIG. 5 shows an example of the flat layout, connecting the P type field relaxing region 9 to the source electrode 7.

In FIG. 5, around a source contact part 15 which is a first contact region for connecting the source electrode 7 with the hetero semiconductor region 3, a plurality of basic unit cells each of which has a periphery including a gate electrode part 17 of the gate electrode 5 are flatly disposed in such a manner as to be connected in parallel to each other. For convenience sake, the basic unit cell is so set as to clarify mutual positions among the structural elements, causing no discontinuity of the materials through walls of the basic unit cells. In FIG. 5, the basic unit cell is denoted, for example, by a quadrangle which is sectioned by a lateral straight line and a longitudinal straight line each passing through the center of a second contact region 14.

Moreover, the second contact region 14 for connecting the P type field relaxing region 9 (the semiconductor region having the second conductivity type) with the source electrode 7 is positioned in one of the following: i) between two or more of the adjacent basic unit cells and ii) around a common contact point of three or more of the basic unit cells. In FIG. 5 setting the basic unit cell denoted by the quadrangle stated above, the second contact region 14 may be set in a position around the common contact point of four of the unit cells which are adjacent to each other in the longitudinal and lateral directions.

An insulating film 16 is formed for electrically insulating the second contact region 14 from the gate electrode part 17.

In FIG. 5, the basic unit cells are equidistantly arranged longitudinally and laterally. The present invention is, however, not limited to the above. The plurality of basic unit cells arranged in the following manner are allowed: i) hexagonal basic unit cells (plan view) each having six sides contacting adjacent counterparts, or ii) round basic unit cells (plan view). For example, in FIG. 5, when the basic unit cells are denoted by a circle around the center of the source contact part 15, the second contact region 14 can be regarded as to be disposed i) between two of the adjacent basic unit cells along a slanting 45° line or ii) between four of the basic unit cells adjacent to each other longitudinally and laterally. Moreover, when the hexagonal basic unit cells (plan view) each have six sides contacting adjacent counterparts, the second contact region 14 may be set around the common contact point of the three basic unit cells adjacent to each other.

<Production Method>

Figure 6:
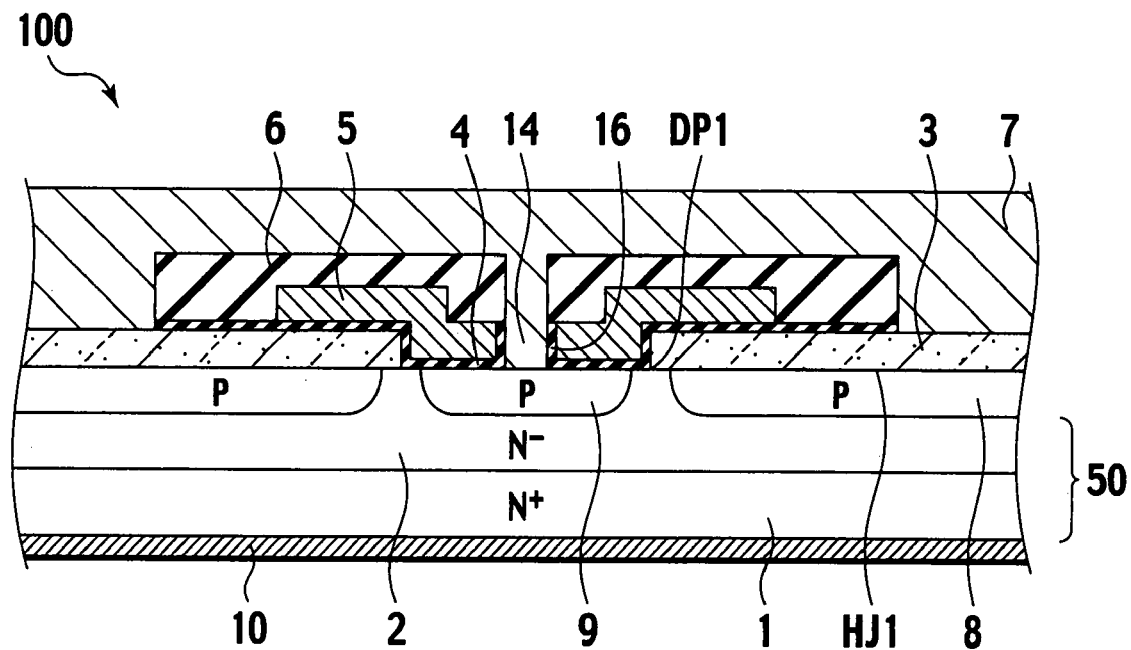
FIG. 6 is a cross sectional view of the semiconductor device, taken along the line VI-VI in FIG. 5.

The cross section denoted by a dot line VI-VI in FIG. 5 is shown in FIG. 6. Between two of the unit cell patterns having the gate electrode part 17 that is relatively wide, the gate electrode 5 is hollowed, directly connecting the source electrode 7 with the field relaxing region 9 in such a manner that the periphery of the unit cell is separated by the insulating film 16. For producing the above structure, the gate electrode 5 and the interlayer insulating film 6 are formed at first, followed by dry etching and the like, to make the hollowing to such an extent as to reach the SiC surface. Then, the thus obtained is subjected to an oxidizing, to thereby form the insulating film 16 on a side wall of the gate electrode 5. In this case, the SiC surface is slightly oxidized. However, oxidizing speed of the SiC is lower than that of the polycrystalline silicon, thereby forming only a thin oxidized film on the SiC surface. After removing the above slightly oxidized film on the SiC surface by a wet etching and the like, the insulating film 16 that is sufficiently thick can be left on the side wall of the polycrystalline silicon (the gate electrode 5). In this way, the semiconductor device 100 having the above structure under the present invention can be produced with ease, which is a special advantage brought about in the production.

<Operation>

Then, an operation of the semiconductor device 100 is to be set forth, according to the first embodiment of the present invention.

<Element Off>

Figure 2:
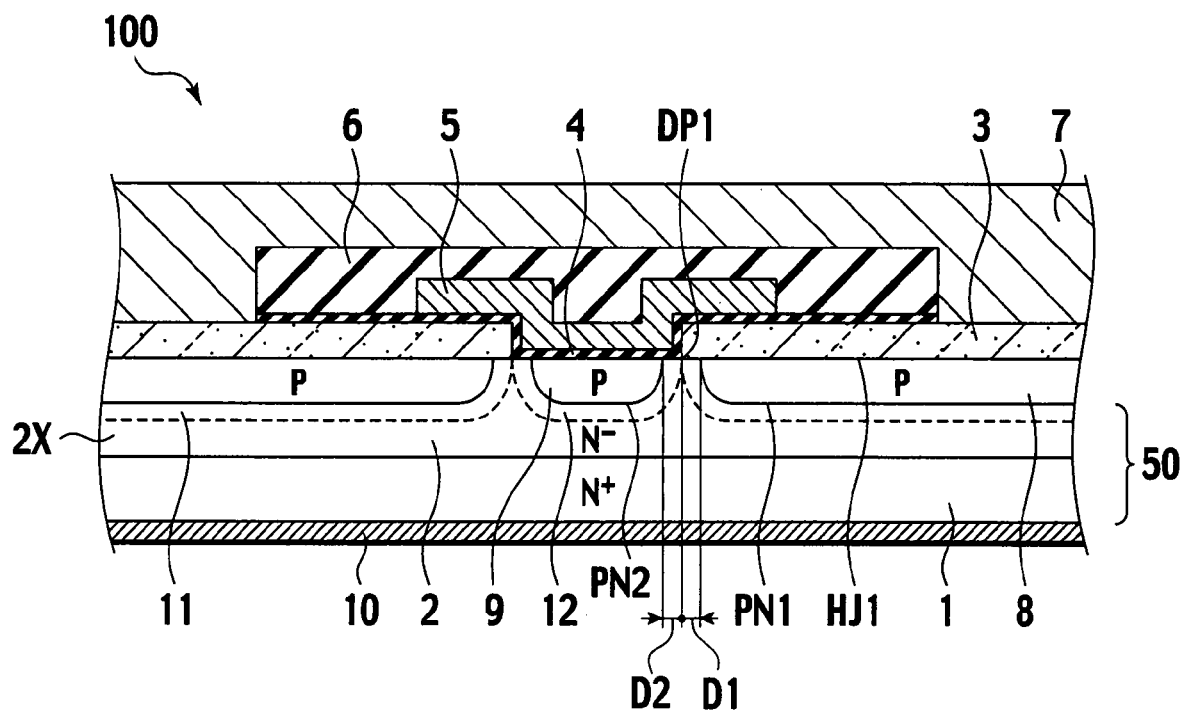
FIG. 2 shows that a built-in depletion layer expands in the cross section of the semiconductor device, according to the first embodiment of the present invention.
Figure 3:
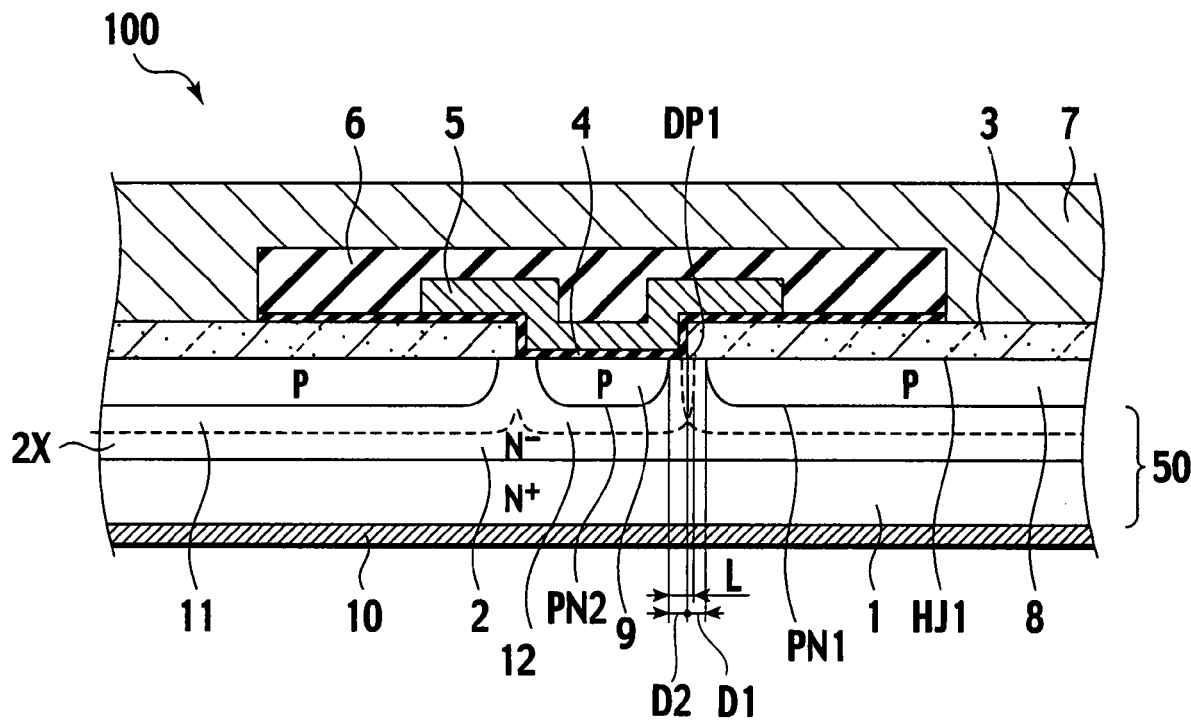
FIG. 3 shows that the depletion layer expands in the cross section of the semiconductor device when the semiconductor device is off, according to the first embodiment of the present invention.

A distance D1 and a distance D2 at which the respective field relaxing regions 8, 9 each are spaced apart from the drive point DP1 are set forth below. As shown in FIG. 2, when the element is off, namely, with the gate electrode 5's potential equal to the source electrode 7's potential, depletion layers 11, 12 caused by a built-in field expand in respective PN junctions PN1, PN2 between each of the respective field relaxing regions 8, 9 and the N⁻ type SiC drain region 2. With an increased potential of the drain electrode 10, the depletion layers 11, 12 will further expand. FIG. 3 shows the above state. In this way, when the element is off, the depletion layers 11, 12 interposing therebetween the drive point DP1 expand, thus effectively implementing the field relaxing. Namely, a leak current from the region (adjacent to the drive point DP1) where the N⁻ type SiC drain region 2 is directly connected to the N⁺ type hetero semiconductor region 3 can be suppressed, thus bringing about an effect of improving the off property of the element. In this case, the depletion layers 11, 12 caused by the built-in field (built-in potential) expand in the respective PN junctions PN1, PN2 between each of the respective field relaxing regions 8, 9 and the N⁻ type SiC drain region 2. A length L of each of the depletion layers 11, 12 is, however, determined according to the SiC's built-in voltage, P type impurity concentration, and the N⁻ type SiC drain region 2's impurity concentration. In the above case, the distance D2 between the field relaxing region 9 (the semiconductor region having the second conductivity type) and the drive point DP1 (triple contact point) is shorter than the length L (extending from the junction PN2) reached by the depletion layer 12 caused by the built-in field (built-in potential) by the junction PN2 between the field relaxing region 9 and the N⁻ type SiC drain region 2, leaving the drive point DP1 in the depletion layer 12.

For allowing the depletion layers 11, 12 to continuously protect i) the drive point DP1 and ii) the junction between the N type hetero semiconductor region 3 and the N⁻ type SiC drain region 2 when the element is off, it is preferable to form the respective field relaxing regions 8, 9 at a distance (the distance D1 and the distance D2) smaller than the length L of each of the respective depletion layers 11, 12. Ordinarily, each of the distance D1 and the distance D2 is in a range of several 1/10 μm to several μm.

<Element On>

Figure 4:
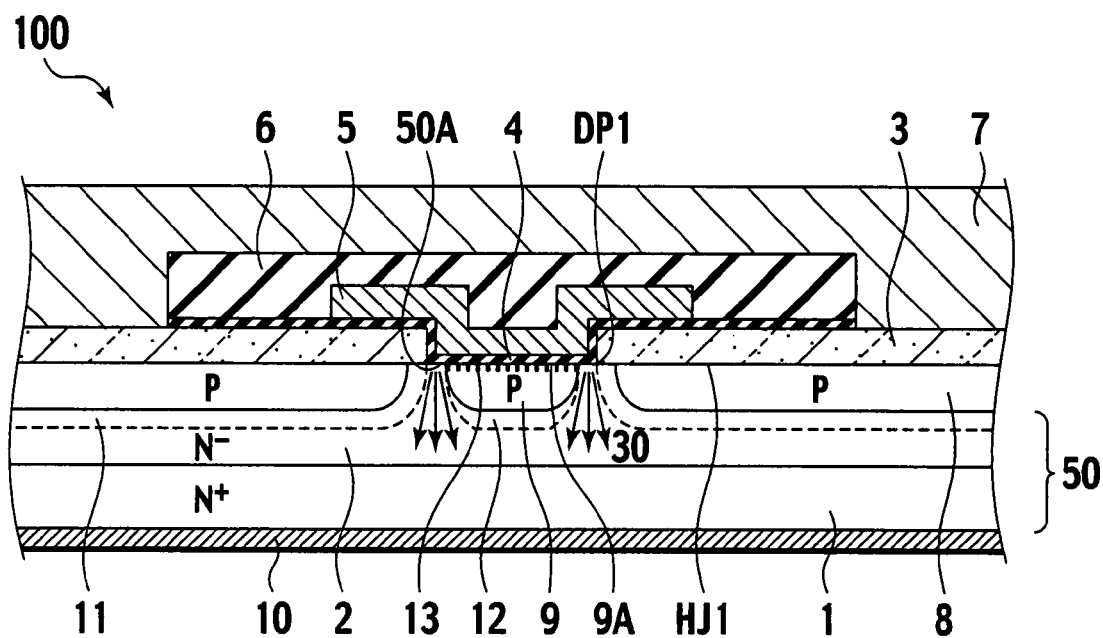
FIG. 4 shows that the depletion layer is reduced and an electron is flowing in the cross section of the semiconductor device when the semiconductor device is on, according to the first embodiment of the present invention.

Referring to FIG. 4, the operation of the semiconductor device 100 when the element is on is to be set forth, according to the first embodiment of the present invention. When the element is on, a positive voltage is applied to the gate electrode 5 based on the source electrode 7, thereby extending the field from the gate electrode 5 to the P type field relaxing region 9, resulting in formation of an inversion layer 13 on a first face 9A of the P type field relaxing region 9. Herein, from characteristical point of view, it is necessary that the impurity concentration of the first face 9A of the P type field relaxing region 9 (semiconductor region having the second conductivity type) should be such that the field from the gate electrode 5 can form the inversion layer 13. Forming of the inversion layer 13 moves back the depletion layer 12 which is formed between the P type field relaxing region 9 and the N⁻ type SiC drain region 2. With the above operations, a current passage 30 for flowing the electron can be secured, as denoted by an arrow in FIG. 4.

As set forth above, with the structure of the semiconductor device 100 according to the first embodiment of the present invention, i) a sufficient field relaxing can be realized when the element is off, while ii) the field from the gate electrode 5 can form the inversion layer 13 on the first face 9A of the P type region 9 when the element is on, thereby the depletion layer 12 expanding between the P type region 9 and the N⁻ type SiC region 2 can be reduced (moved back), to thereby sufficiently secure the current passage 30. In other words, the trade-off relation when the element is in off or on state can be improved, bringing about an effect of realizing the element featuring high voltage capability (high reverse blocking voltage) and low on-resistance.

Second Embodiment

Figure 7:
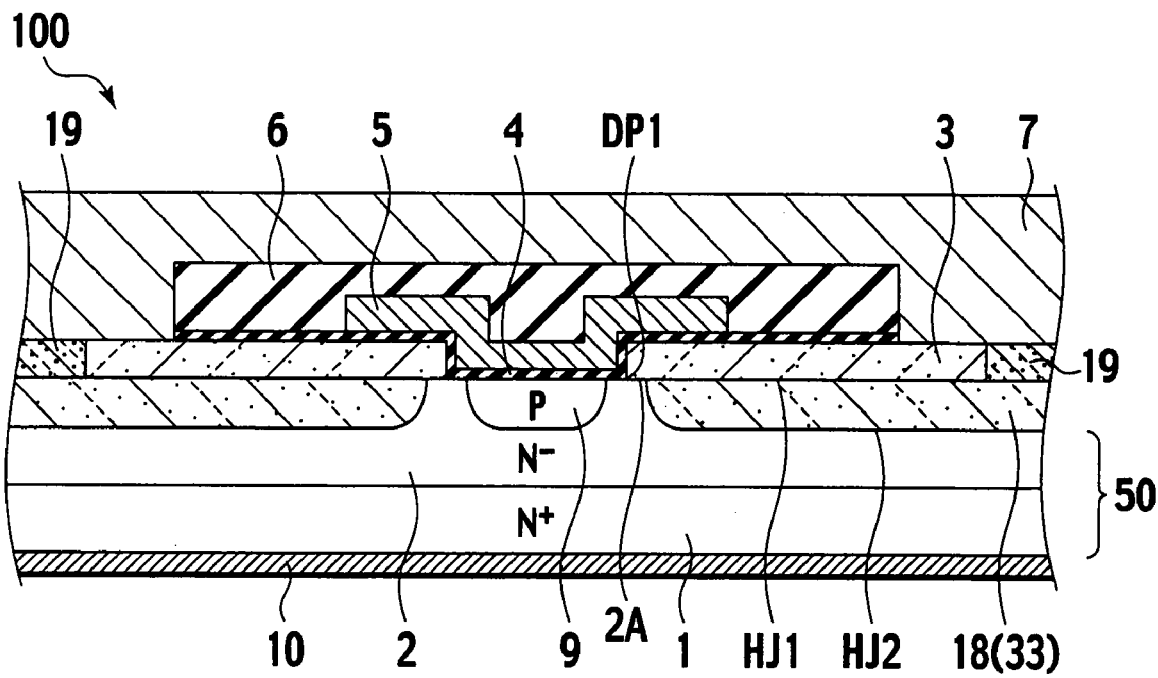
FIG. 7 is a cross sectional view of the semiconductor device, according to a second embodiment of the present invention.

Referring to FIG. 7, the semiconductor device 100 is to be set forth, according to the second embodiment of the present invention.

<Structure>

The semiconductor device 100 has such a structure that a slit part 33 is formed in the N⁻ type SiC drain region 2 below the hetero semiconductor region 3, with a P⁺ type hetero semiconductor 18 embedded in the slit part 33. By way of a connection part 19 made of P⁺ type hetero semiconductor, the P⁺ type hetero semiconductor 18 connects to the source electrode 7.

With the above structure, the barrier height of a hetero junction HJ2 (hetero interface) formed between the P⁺ type hetero semiconductor 18 and the N⁻ type SiC drain region 2 is larger than in the case of the N type hetero semiconductor, thereby bringing about a junction featuring lower leak and higher voltage capability. A depletion layer (not shown in FIG. 7) from the above hetero junction HJ2 (hetero interface) expands, thereby bringing about an effect of suppressing an opposite leak current, together with the effect brought about by the depletion layer (not shown in FIG. 7) from the field relaxing region 9 below the gate electrode 5.

The property of the element when the element is on according to the second embodiment is equivalent to that according to the first embodiment.

<Production Method>

Set forth below is a production method according to the second embodiment. Specifically, a dry etching and the like is used for forming the slit part 33 in the first face 2A of the N⁻ type SiC drain region 2, followed by a sacrificial oxidizing, and still followed by removing damages such as a sacrificial oxidized film. Then, the P⁺ type polycrystalline silicon is accumulated, followed by a flattening etching such as CMP (Chemical Mechanical Polishing) and the like, still followed by patterning of the P⁺ type polycrystalline silicon, to thereby form the semiconductor device 100. The connection part 19 can be easily formed by a selective impurity implantation to the N type hetero semiconductor region 3.

As set forth above, according to the second embodiment, forming of the field relaxing region by using the hetero junction HJ2 between the P⁺ type hetero semiconductor 18 and the N⁻ type SiC drain region 2 can improve the trade off relation in off or on state of the element, bringing about an effect of realizing the element featuring high voltage capability (high reverse blocking voltage) and low on-resistance.

Third Embodiment

Figure 8:
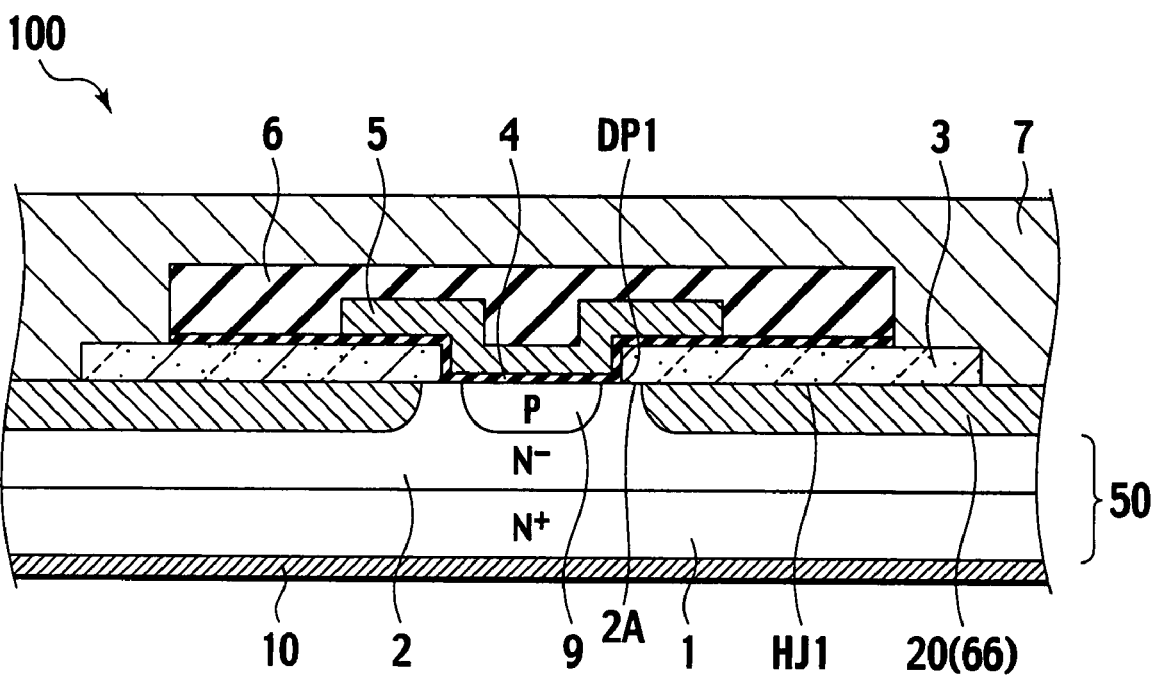
FIG. 8 is a cross sectional view of the semiconductor device, according to a third embodiment of the present invention.

Referring to FIG. 8, the semiconductor device 100 is to be set forth, according to the third embodiment of the present invention.

<Structure>

The semiconductor device 100 has such a structure that a slit part 66 is formed in the N⁻ type SiC drain region 2 below the hetero semiconductor region 3, with a Schottky electrode 20 embedded in the slit part 66.

With the above structure, a depletion layer (not shown in FIG. 8) from the Schottky electrode 20 (Schottky interface) expands, thereby bringing about an effect of suppressing the opposite leak current, together with the effect brought about by the depletion layer (not shown in FIG. 8) from the field relaxing region 9 below the gate electrode 5.

The property of the element when the element is on according to the third embodiment is equivalent to that according to the first embodiment.

<Production Method>

Set forth below is a production method according to the third embodiment.

Specifically, a dry etching and the like is used for forming the slit part 66 on the first face 2A of the N⁻ type SiC drain region 2, followed by a sacrificial oxidizing, and still followed by removing damages such as a sacrificial oxidized film.

Then, a Schottky metal is accumulated, followed by a flattening such as CMP (Chemical Mechanical Polishing) and the like, to thereby form the semiconductor device 100.

As set forth above, with the structure of the semiconductor device 100 according to the second and third embodiments of the present invention, i) a sufficient field relaxing can be realized when the element is off, while ii) the field from the gate electrode can form the inversion layer on the first face of the P type region when the element is on, thereby the depletion layer expanding between the P type region and the N type SiC region can be reduced, to thereby sufficiently secure the current passage.

In other words, the trade off relation when the element is in off or on state can be improved, bringing about an effect of realizing the element featuring high voltage capability (high reverse blocking voltage) and low on-resistance.

Fourth, Fifth and Six Embodiments

According to the following fourth, fifth and sixth embodiments of the present invention, there is provided the semiconductor device where the semiconductor substrate is made of silicon carbide SiC, the hetero semiconductor region is made of polycrystalline silicon, the first conductivity type is N, and the second conductivity type is P.

Fourth Embodiment

Figure 9:
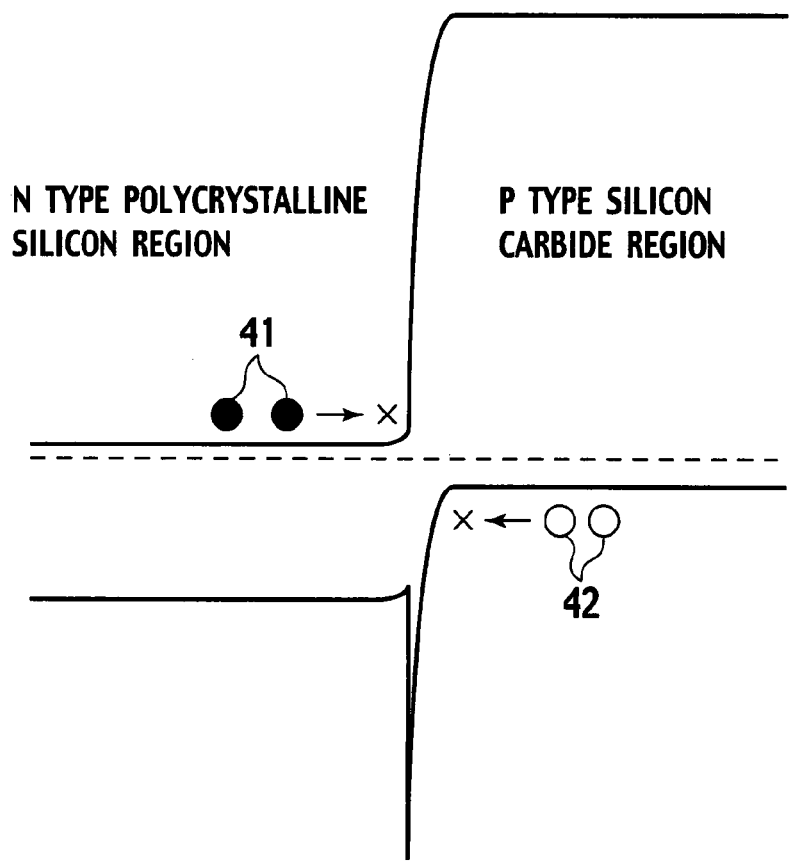
FIG. 9 shows an energy band, according to a fourth embodiment of the present invention.
Figure 10:
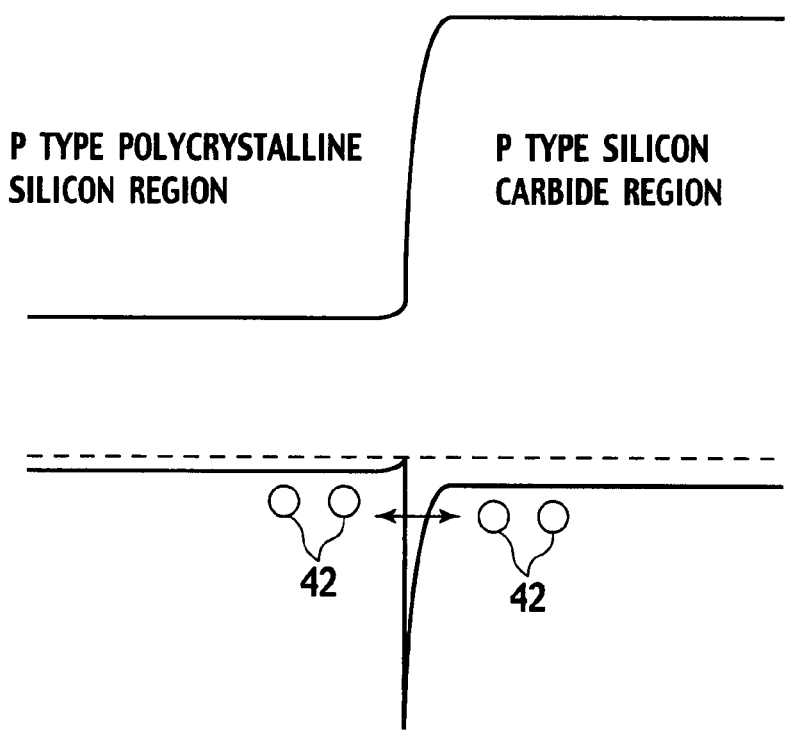
FIG. 10 shows an energy band, according to the fourth embodiment of the present invention.
Figure 11:
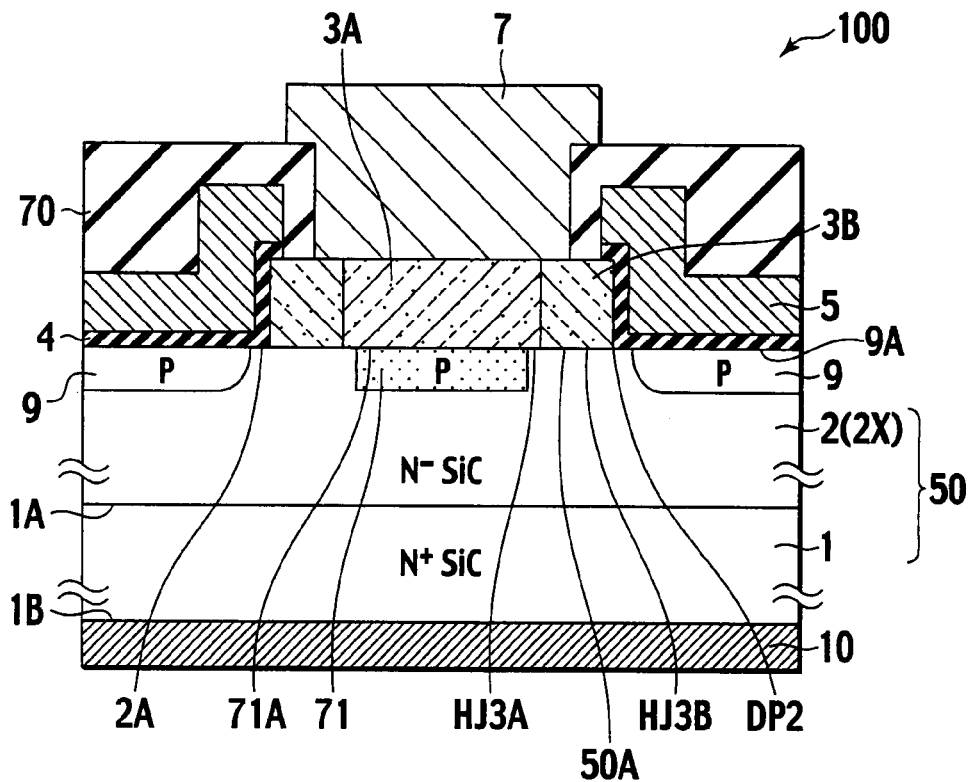
FIG. 11 shows a cross sectional structure of the semiconductor device, according to the fourth embodiment of the present invention.

Referring to FIG. 9 to FIG. 11, an explanation is to be made, according to the fourth embodiment of the present invention.

FIG. 9 shows an energy band adjacent to a hetero junction between an N type polycrystalline silicon region and a P type silicon carbide region. An electron 41 of the N type polycrystalline silicon region and a positive hole 42 of the P type silicon carbide region are barred by the energy barrier, failing to make a free movement with each other.

FIG. 10 shows an energy band adjacent to a hetero junction between a P type polycrystalline silicon region and the P type silicon carbide region. Sufficiently increasing impurity concentration of the P type silicon carbide region decreases thickness of the energy barrier, allowing the positive holes 42 of the respective P type polycrystalline silicon region and P type silicon carbide region to tunnel the energy barrier, resulting in free movement with each other. In other words, the P type polycrystalline silicon region and the P type silicon carbide region have an ohmic contact.

Moreover, forming an ohmic contact between a source electrode and the P type polycrystalline silicon region is accomplished by sufficiently increasing the impurity concentration in the P type polycrystalline silicon region, which is a technology commonly used for silicon LSI (=Large Scale Integration), power device and the like.

With the above principle, the source electrode and the P type silicon carbide region can have the ohmic contact by way of the P type polycrystalline silicon region.

<Structure>

FIG. 11 shows the semiconductor device 100, according to the fourth embodiment. More specifically, FIG. 11 shows a cross sectional view of a unit cell, actually however, a plurality of the unit cells are connected in parallel.

On the N⁺ type SiC substrate 1 having the first conductivity type and serving as drain region, an N⁻ type silicon carbide epitaxial layer 2X is laminated, thereby forming the semiconductor substrate 50 having the first conductivity type. In a certain region of the N⁻ type silicon carbide epitaxial layer 2X, there is formed a P type field relaxing region 71 having the second conductivity type and a first face 71A.

In a certain region of the first face 2A of the epitaxial layer surface 2 of the semiconductor substrate 50, there are formed i) an N type polycrystalline silicon region 3B serving as a first hetero semiconductor region and ii) a P type polycrystalline silicon region 3A serving as a second hetero semiconductor region. The polycrystalline silicon layers (i.e., the N type polycrystalline silicon region 3B and the P type polycrystalline silicon region 3A) each have a band gap which is different from that of the silicon carbide, forming hetero junctions HJ3A, HJ3B (including the field relaxing region 71) in combination with the epitaxial layer 2X, with the energy barrier present in the junction.

Moreover, adjacent to the hetero junction HJ3B which is an interface between the epitaxial layer 2X and the N type polycrystalline silicon region 3B, there is provided the gate electrode 5 by way of the gate insulating film 4.

As show in FIG. 11, in a location spaced apart by a certain distance from a drive point DP2 where the N type polycrystalline silicon region 3B (serving as the first hetero semiconductor region), the epitaxial layer 2X (serving as a part of the semiconductor substrate 50) and the gate insulating film 4 contact each other, the field relaxing region 71 is formed in the semiconductor substrate 50.

The P type field relaxing region 71 relaxes the field applied to the hetero junction HJ3A, the hetero junction HJ3B and the drive point DP2.

On the P type polycrystalline silicon regions 3A, the N type polycrystalline silicon region 3B and gate electrode 5, there is formed an interlayer insulating film 70. The N type polycrystalline silicon region 3B and the P type polycrystalline silicon region 3A connect to the source electrode 7. On the second face 1B of the N⁺ type SiC substrate 1, there is formed the drain electrode 10.

In addition, the field relaxing region 9 is provided below the gate electrode 5.

According to the fourth embodiment, making a part of the polycrystalline silicon region 3A (a structural element) into P type can, as set forth above, allows the source electrode 7 and the P type field relaxing region 71 to easily have the ohmic contact by way of the P type polycrystalline silicon region 3A serving as the second hetero semiconductor region.

According to the fourth embodiment, allowing the P type field relaxing region 71 and the source electrode 7 to have the ohmic contact by way of the P type polycrystalline silicon region 3A can build in a diode with the source electrode 7 serving as an anode and the drain electrode 10 serving as a cathode.

Moreover, pulling to the source electrode 7 the positive hole 42 flowing in the P type field relaxing region 71 can suppress a parasitic bipolar transistor effect which may be brought about by the N type polycrystalline silicon region 3B, the P type field relaxing region 71 and the N⁻ type silicon carbide epitaxial layer 2X serving respectively as emitter, base and collector, thereby suppressing breakage of the element which breakage may be caused by a large current attributable to the parasitic bipolar transistor in on state. In sum, the semiconductor device 100 according to the fourth embodiment is unlikely to cause the current breakage.

Fifth Embodiment

Structure

Figure 12:
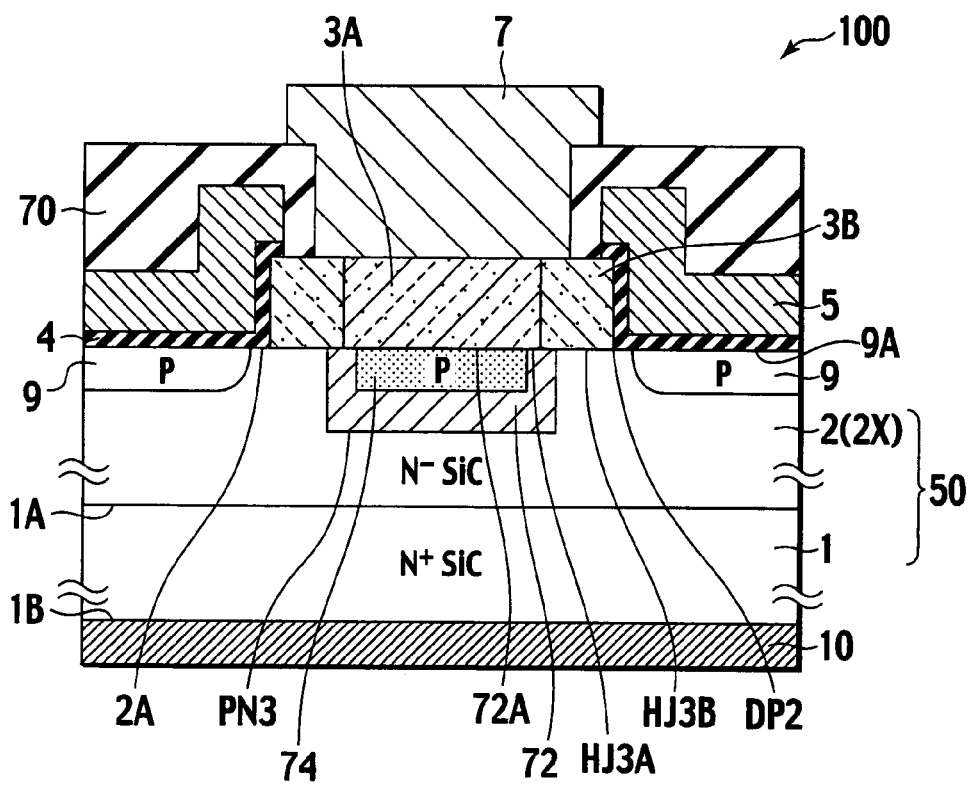
FIG. 12 shows a cross sectional structure of the semiconductor device, according to a fifth embodiment of the present invention.

FIG. 12 shows the semiconductor device 100, according to the fifth embodiment of the present invention. More specifically, FIG. 12 shows a cross sectional view of the unit cell, actually however, a plurality of the unit cells are connected in parallel.

The fifth embodiment is different from the fourth embodiment in that a P type punch through preventing region 74 is formed in a P type field relaxing region 72 having a first face 72A and that the P type field relaxing region 72 connects to the P type polycrystalline silicon region 3A by way of the P type punch through preventing region 74.

The P type field relaxing region 72 relaxes the field applied to the hetero junction HJ3A, the hetero junction HJ3B and the drive point DP2.

Increasing the impurity concentration of the hetero junctions HJ3A, HJ3B (in other words, increasing the impurity concentration of the P type punch through preventing region 74, for example, to more than or equal to that of the P type field relaxing region 72) can further decrease the resistance of the ohmic contact in the hetero junctions HJ3A, HJ3B. In addition, further decreasing the impurity concentration of the P type field relaxing region 72 on a junction PN3 between the P type field relaxing region 72 and the N⁻ type silicon carbide epitaxial layer 2X can further suppress field concentration at an end part of the P type field relaxing region 72.

According to the fifth embodiment, allowing the P type punch through preventing region 74 and the source electrode 7 to have the further lower resistance ohmic contact by way of the P type polycrystalline silicon region 3A can build in a diode causing a loss lower than that caused by the diode with the source electrode 7 serving as the anode and the drain electrode 10 serving as the cathode.

Moreover, pulling to the source electrode 7 at a lower resistance the positive hole 42 flowing in the P type field relaxing region 72 can suppress the parasitic bipolar transistor effect which may be brought about by the N type polycrystalline silicon region 3B, the P type field relaxing region 72 and the N⁻ type silicon carbide epitaxial layer 2X serving respectively as emitter, base and collector, thereby suppressing breakage of the element which breakage may be caused by a large current attributable to the parasitic bipolar transistor in on state. In sum, the semiconductor device 100 according to the fifth embodiment is unlikely to cause the current breakage.

Sixth Embodiment

Structure

Figure 13:
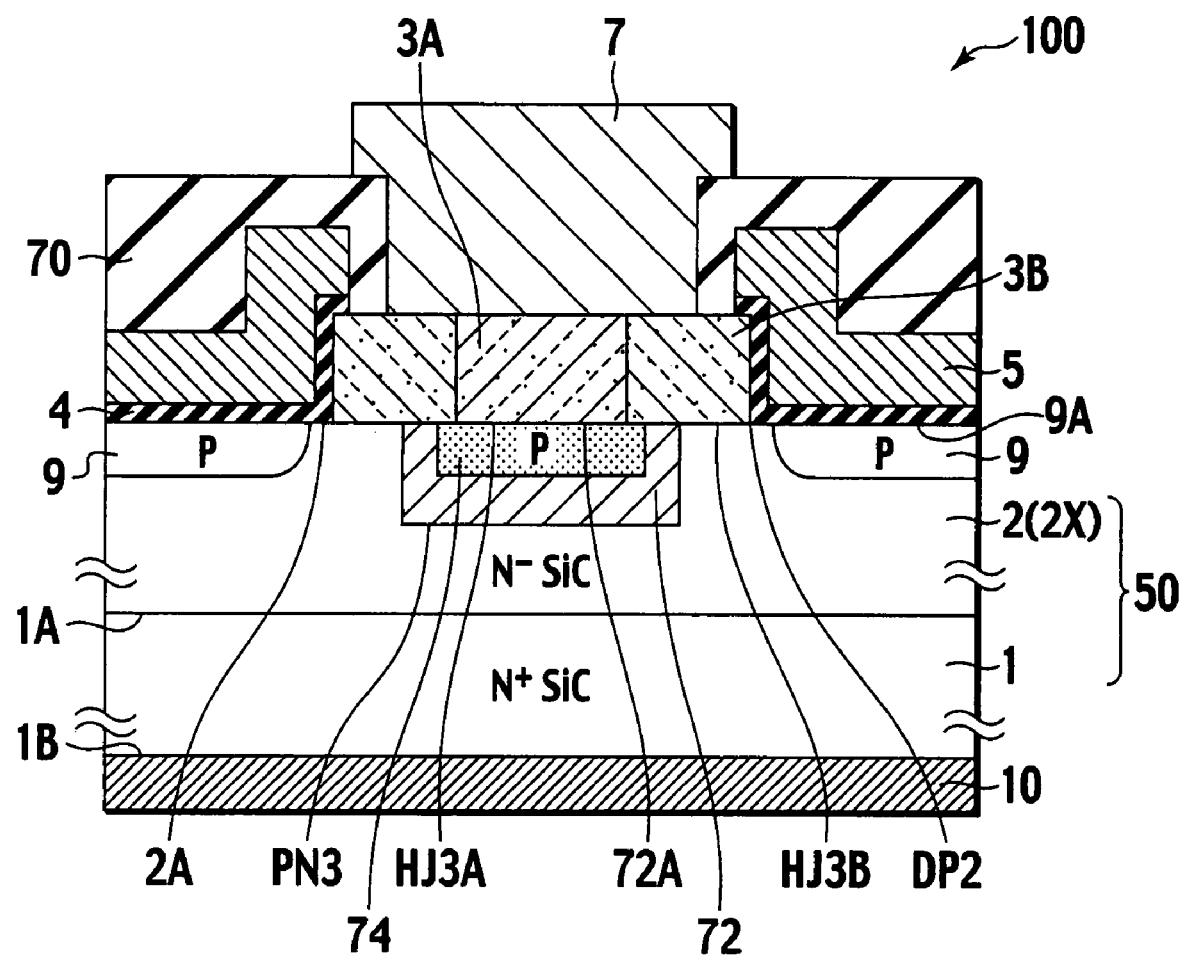
FIG. 13 shows a cross sectional structure of the semiconductor device, according to a sixth embodiment of the present invention.

FIG. 13 shows the semiconductor device 100, according to the sixth embodiment of the present invention. More specifically, FIG. 13 shows a cross sectional view of the unit cell, actually however, a plurality of the unit cells are connected in parallel.

The sixth embodiment is different from the fifth embodiment in that the hetero junction HJ3A which is an interface between the semiconductor substrate 50 and the P type polycrystalline silicon region 3A (which is the second hetero semiconductor region) is positioned in the P type punch through preventing region 74. With the above structure, even when the P type field relaxing region 72 is depleted, the ohmic contact area between the P type punch through preventing region 74 and the P type polycrystalline silicon region 3A remain unchanged, bringing about a stable ohmic contact.

According to the sixth embodiment, allowing the P type punch through preventing region 74 and the source electrode 7 to have more stable ohmic contact by way of the P type polycrystalline silicon region 3A can further stabilize operation of the built-in diode with the source electrode 7 serving as the anode and the drain electrode 10 serving as the cathode.

Moreover, stably pulling to the source electrode 7 the positive hole 42 flowing in the P type field relaxing region 72 can suppress the parasitic bipolar transistor effect which may be brought about by the N type polycrystalline silicon region 3B, the P type field relaxing region 72 and the N⁻ type silicon carbide epitaxial layer 2X serving respectively as emitter, base and collector, thereby suppressing breakage of the element which breakage may be caused by a large current attributable to parasitic bipolar transistor in on state. In sum, the semiconductor device 100 according to the sixth embodiment is unlikely to cause the current breakage.

Fourth, Fifth and Sixth Embodiments

According to the fourth, fifth and sixth embodiments, connecting the P type field relaxing region 71, 72(74), 72(74) with the source electrode 7 by way of the P type polycrystalline silicon region 3A can lower the resistance of the ohmic contact between the P type field relaxing region 71, 72(74), 72(74) and the source electrode 7.

As a result, the diode having the source electrode 7 as anode and the drain electrode 10 as cathode can be built in. Above can eliminate the need of forming, in one of the following, a commutation diode in an inverter circuit: i) another region in the same semiconductor substrate 50 and ii) another substrate. With this, the inverter circuit can be smaller and cost can be decreased.

Moreover, pulling to the source electrode 7 the positive hole 42 flowing in the P type field relaxing region 71, 72, 72 can suppress the parasitic bipolar transistor effect which may be brought about by the N type polycrystalline silicon region 3B, the P type field relaxing region 71, 72, 72 and the N⁻ type silicon carbide epitaxial layer 2X serving respectively as emitter, base and collector, thereby suppressing breakage of the element, resulting in an improvement of breakage resistance of the element.

Although the present invention has been described above by reference to six embodiments, the present invention is not limited to the six embodiments described above. Modifications and variations of the six embodiments described above will occur to those skilled in the art, in light of the above teachings.

According to the first to sixth embodiments, the first conductivity type is N and the second conductivity type is P. The present invention is, however, not limited to the above. The first conductivity type may be P and the second conductivity type may be N, bringing about the same effect according to the first to sixth embodiments of the present invention.

Moreover, not limited to the silicon carbide, the material of the semiconductor substrate 50 may be selected from the group consisting of gallium nitride and diamond.

Moreover, not limited to the polycrystalline silicon, the hetero semiconductor region 3 according to the first to third embodiments may be made of a martial selected from the group consisting of single crystalline silicon and amorphous silicon.

Likewise, not limited to the polycrystalline silicon, the first hetero semiconductor region (specifically, the region 3B) and the second hetero semiconductor region (specifically, the region 3A) each according to the fourth to sixth embodiments may be made of a material selected from the group consisting of single crystalline silicon, amorphous silicon, single crystalline silicon germanium, polycrystalline silicon germanium and amorphous silicon germanium.

Otherwise, the first hetero semiconductor region (specifically, the region 3B) and the second hetero semiconductor region (specifically, the region 3A) each according to the fourth to sixth embodiments may be made of a martial selected from the group consisting of single crystalline germanium, polycrystalline germanium, amorphous germanium, single crystalline gallium arsenide, polycrystalline gallium arsenide and amorphous gallium arsenide.

This application is based on a prior Japanese Patent Application No. P2006-031887 (filed on Feb. 9, 2006 in Japan) and a prior Japanese Patent Application No. P2006-032596 (filed on Feb. 9, 2006 in Japan). The entire contents of the Japanese Patent Applications No. P2006-031887 and P2006-032596 from which priority is claimed are incorporated herein by reference, in order to take some protection against translation errors or omitted portions.

The scope of the present invention is defined with reference to the following claims.

What is claimed is:

1. A semiconductor device, comprising:
   a first conductivity-semiconductor substrate;
   a hetero semiconductor region configured to form a hetero junction in combination with the first conductivity-semiconductor substrate;
   a gate electrode configured to be adjacent to a part of the hetero junction by way of a gate insulating film;
   a drain electrode configured to connect to the first conductivity-semiconductor substrate;
   a source electrode configured to connect to the hetero semiconductor region; and
   a second conductivity-semiconductor region which is a field relaxing region formed on a part of a first face of the first conductivity-semiconductor substrate in such a configuration as to oppose the gate electrode by way of the gate insulating film, the gate insulating film, the hetero semiconductor region and the first conductivity-semiconductor substrate contacting each other to thereby form a triple contact point,
   wherein a first face of the second conductivity-semiconductor region has an impurity concentration that allows a field from the gate electrode to form an inversion layer on the first face of the second conductivity-semiconductor region,
   wherein a depletion layer is formed by a junction between the second conductivity-semiconductor region and the first conductivity-semiconductor substrate,
   wherein the inversion layer controls a thickness of the depletion layer, and
   wherein a distance between the second conductivity-semiconductor region and the triple contact point is smaller than a length reached by the depletion layer attributable to a built-in potential.

2. The semiconductor device as claimed in claim 1, wherein
   the second conductivity-semiconductor region is configured to be electrically connected to the source electrode.

3. The semiconductor device as claimed in claim 1, wherein
   around a first contact region configured to connect the source electrode to the hetero semiconductor region, a plurality of basic unit cells each of which has a periphery including a part of the gate electrode are flatly disposed in such a configuration as to be connected in parallel to each other, and
   a second contact region configured to connect the second conductivity-semiconductor region to the source electrode is positioned in one of the following:
      between two or more of the basic unit cells adjacent to each other, or
      around a common contact point of three or more of the basic unit cells.

4. The semiconductor device as claimed in claim 1, wherein
   the first conductivity-semiconductor substrate is made of a material selected from the group consisting of silicon carbide, gallium nitride and diamond.

5. The semiconductor device as claimed in claim 1, wherein
   the hetero semiconductor region is made of a material selected from the group consisting of single crystalline silicon, polycrystalline silicon and amorphous silicon.

6. The semiconductor device according to claim 2, wherein the hetero semiconductor region includes:
   a first hetero semiconductor region formed in a first certain region of the first face of the first conductivity-semiconductor substrate, and having a first semiconductor material which is different from a semiconductor material of the first conductivity-semiconductor substrate in band gap, and
   a second hetero semiconductor region in a second certain region of the first face of the first conductivity-semiconductor substrate, and having a second semiconductor material which is different from the semiconductor material of the first conductivity-semiconductor substrate in band gap, the second hetero semiconductor region having the second conductivity;
   the gate electrode is configured to be adjacent to a first hetero junction of the hetero junction by way of the gate insulating film, the first hetero junction being an interface between the first conductivity-semiconductor substrate and the first hetero semiconductor region, and
   the source electrode is configured to connect to the first hetero semiconductor region and the second hetero semiconductor region, and
   in a location spaced apart by a certain distance from a triple contact point where the first hetero semiconductor region, the first conductivity-semiconductor substrate and the gate insulating film contact each other, the field relaxing region having the second conductivity is formed in the semiconductor substrate in such a configuration as to oppose the hetero semiconductor region, the field relaxing region being configured to be electrically connected to the source electrode.

7. The semiconductor device according to claim 6, wherein the field relaxing region and the source electrode form an ohmic connection by way of the second hetero semiconductor region.

8. The semiconductor device according to claim 6, wherein
the field relaxing region having the second conductivity has a punch through preventing region having the second conductivity, the punch through preventing region being configured to have an impurity concentration more than or equal to that of the field relaxing region having the second conductivity, and
the punch through preventing region and the source electrode form an ohmic connection by way of the second hetero semiconductor region.

9. The semiconductor device as claimed in claim 8, wherein
the hetero junction includes a second hetero junction which is an interface between the first conductivity-semiconductor substrate and the second hetero semiconductor region is configured to be positioned in the punch through preventing region.

10. The semiconductor device as claimed in claim 6, wherein
the first hetero semiconductor region has the first conductivity.

11. The semiconductor device as claimed in claim 6, wherein
the first hetero semiconductor region and the second hetero semiconductor region each are made of a material selected from the group consisting of single crystalline silicon, polycrystalline silicon, amorphous silicon, single crystalline silicon germanium, polycrystalline silicon germanium and amorphous silicon germanium.

12. The semiconductor device as claimed in claim 6, wherein
the first hetero semiconductor region and the second hetero semiconductor region each are made of a material selected from the group consisting of single crystalline germanium, polycrystalline germanium, amorphous germanium, single crystalline gallium arsenide, polycrystalline gallium arsenide and amorphous gallium arsenide.

13. The semiconductor device according to claim 1, wherein the inversion layer reduces the thickness of the depletion layer to secure a passage of a current flowing in a vicinity of the triple contact point.

\* \* \* \* \*